US009583533B2

(12) United States Patent
Hu et al.

(10) Patent No.: US 9,583,533 B2
(45) Date of Patent: Feb. 28, 2017

(54) LED DEVICE WITH EMBEDDED NANOWIRE LEDS

(71) Applicant: LuxVue Technology Corporation, Santa Clara, CA (US)

(72) Inventors: Hsin-Hua Hu, Los Altos, CA (US); Andreas Bibl, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/210,295

(22) Filed: Mar. 13, 2014

(65) Prior Publication Data

US 2015/0263066 A1    Sep. 17, 2015

(51) Int. Cl.
*H01L 29/06*        (2006.01)
*H01L 27/15*        (2006.01)
*H01L 33/18*        (2010.01)
*H01L 25/075*       (2006.01)
*H01L 33/08*        (2010.01)
*H01L 33/16*        (2010.01)
*H01L 23/00*        (2006.01)
*H01L 33/00*        (2010.01)
*H01L 33/24*        (2010.01)

(52) U.S. Cl.
CPC ............ *H01L 27/153* (2013.01); *H01L 24/75* (2013.01); *H01L 24/83* (2013.01); *H01L 24/95* (2013.01); *H01L 25/0753* (2013.01); *H01L 29/0669* (2013.01); *H01L 29/0676* (2013.01); *H01L 33/08* (2013.01); *H01L 33/16* (2013.01); *H01L 33/18* (2013.01); *H01L 33/0079* (2013.01); *H01L 33/0095* (2013.01); *H01L 33/24* (2013.01)

(58) Field of Classification Search
CPC . H01L 29/0669; H01L 29/0676; H01L 33/08; H01L 33/18
USPC .......................... 257/13, 79, 81, 91, 95, 100
See application file for complete search history.

(56) References Cited

U.S. PATENT DOCUMENTS

| 3,717,743 A | 2/1973 | Costello |
| 3,935,986 A | 2/1976 | Lattari et al. |
| 5,131,582 A | 7/1992 | Kaplan et al. |
| 5,378,926 A | 1/1995 | Chi et al. |

(Continued)

FOREIGN PATENT DOCUMENTS

| DE | 10 2011 056 140 A1 | 6/2013 | |
| DE | 102011056140 A1 * | 6/2013 | ............. H01L 33/18 |

(Continued)

OTHER PUBLICATIONS

PCT International Search Report and Written Opinion for International Application No. PCT/US2015/016696, mailed May 29, 2015, 14 pages.

(Continued)

Primary Examiner — Matthew E Warren
(74) Attorney, Agent, or Firm — Blakely, Sokoloff, Taylor & Zafman LLP

(57) ABSTRACT

A nanowire device and a method of forming a nanowire device that is poised for pick up and transfer to a receiving substrate are described. In an embodiment, the nanowire device includes a base layer and a plurality of nanowires on and protruding away from a first surface of the base layer. An encapsulation material laterally surrounds the plurality of nanowires in the nanowire device, such that the nanowires are embedded within the encapsulation material.

20 Claims, 14 Drawing Sheets

(56) References Cited

U.S. PATENT DOCUMENTS

| | | |
|---|---|---|
| 5,435,857 A | 7/1995 | Han et al. |
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,081,414 A | 6/2000 | Flanigan et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,396,696 B2 | 7/2008 | Kim et al. |
| 7,439,549 B2 | 10/2008 | Marchl et al. |
| 7,585,703 B2 | 9/2009 | Matsumura et al. |
| 7,628,309 B1 | 12/2009 | Eriksen et al. |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,829,443 B2 | 11/2010 | Seifert et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,329,049 B2 | 12/2012 | Ebels et al. |
| 8,333,860 B1 | 12/2012 | Bibl et al. |
| 8,349,116 B1 | 1/2013 | Bibl et al. |
| 8,426,227 B1 | 4/2013 | Bibl et al. |
| 8,518,204 B2 | 8/2013 | Hu et al. |
| 2001/0029088 A1 | 10/2001 | Odajima et al. |
| 2002/0076848 A1 | 6/2002 | Spooner et al. |
| 2002/0153832 A1 | 10/2002 | Yanagisawa et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 | 10/2005 | Liu |
| 2005/0232728 A1 | 10/2005 | Rice et al. |
| 2006/0038291 A1 | 2/2006 | Chung et al. |
| 2006/0055035 A1 | 3/2006 | Lin et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2008/0012030 A1 | 1/2008 | Yoon et al. |
| 2008/0048206 A1 | 2/2008 | Lee et al. |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2009/0068774 A1 | 3/2009 | Slater et al. |
| 2009/0072382 A1 | 3/2009 | Guzek |
| 2009/0146303 A1 | 6/2009 | Kwon |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0248484 A1 | 9/2010 | Bower et al. |
| 2010/0276726 A1 | 11/2010 | Cho et al. |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0240959 A1 | 10/2011 | Konsek et al. |
| 2011/0254034 A1 | 10/2011 | Konsek et al. |
| 2011/0291134 A1 | 12/2011 | Kang |
| 2011/0297914 A1 | 12/2011 | Zheng et al. |
| 2011/0309382 A1 | 12/2011 | Lowgren |
| 2011/0312131 A1 | 12/2011 | Renavikar et al. |
| 2012/0018494 A1 | 1/2012 | Jang et al. |
| 2012/0064642 A1 | 3/2012 | Huang et al. |
| 2012/0134065 A1 | 5/2012 | Furuya et al. |
| 2012/0161100 A1 | 6/2012 | Hsu |
| 2012/0261686 A1* | 10/2012 | Lu .................... H01L 33/007 257/91 |
| 2013/0019996 A1 | 1/2013 | Routledge |
| 2013/0038416 A1 | 2/2013 | Arai et al. |
| 2013/0112944 A1* | 5/2013 | Cha .................... B82Y 20/00 257/13 |
| 2013/0130440 A1 | 5/2013 | Hu et al. |
| 2013/0134591 A1 | 5/2013 | Sakamoto et al. |
| 2013/0161682 A1 | 6/2013 | Liang et al. |
| 2014/0034120 A1* | 2/2014 | Wang ............... H01L 21/02521 136/255 |
| 2014/0252313 A1* | 9/2014 | Mariani ............ H01L 31/1884 257/21 |
| 2015/0111363 A1 | 4/2015 | Lei et al. |
| 2015/0372194 A1* | 12/2015 | Cha .................... H01L 33/20 257/9 |

FOREIGN PATENT DOCUMENTS

| | | |
|---|---|---|
| JP | 07-060675 A | 3/1995 |
| JP | 11-142878 | 5/1999 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |

(56) References Cited

FOREIGN PATENT DOCUMENTS

| | | |
|---|---|---|
| JP | 2010-161212 A | 7/2010 |
| JP | 2010-186829 A | 8/2010 |
| JP | 2011-181834 A | 9/2011 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| TW | 201228023 | 7/2012 |
| WO | WO 2005-099310 A2 | 10/2005 |
| WO | WO 2011/123285 | 10/2011 |
| WO | WO 2013/074370 A1 | 5/2013 |

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

Lee et al, "GaN/In1—xGaxN/GaN/ZnO nanoarchitecture light emitting diode microarrays" American Institute of Physics, Applied Physics Letters 94, 213101, May 26, 2009, 3 pgs.

Krames et al., "Why Nanowire LEDs?" IEEE J. Display Tech., Jun. 2007, pp. 5-6.

PCT International Preliminary Report on Patentability for International Application No. PCT/US2015/016696, mailed Sep. 22, 2016, 10 pages.

\* cited by examiner

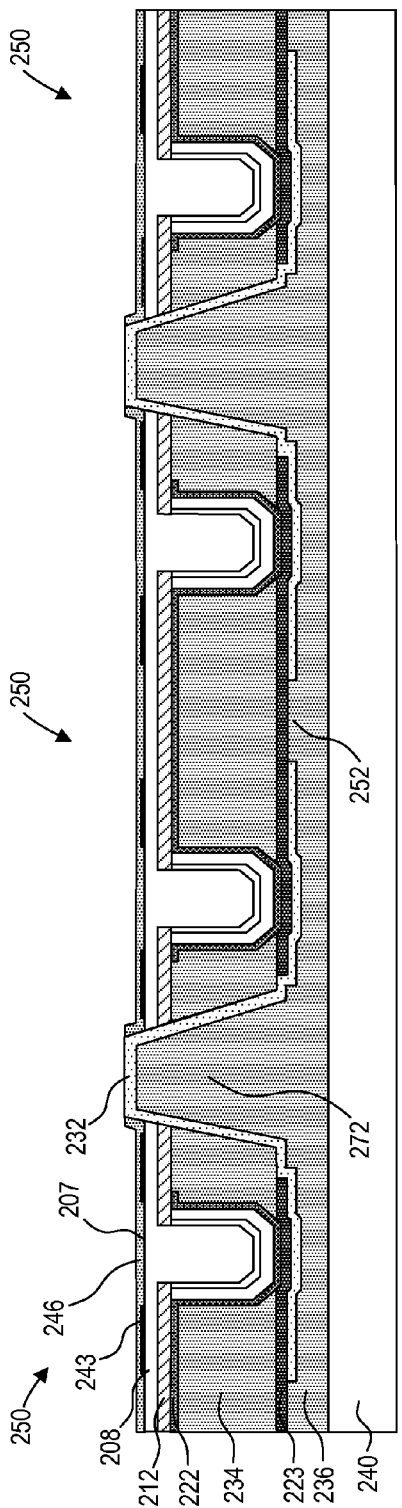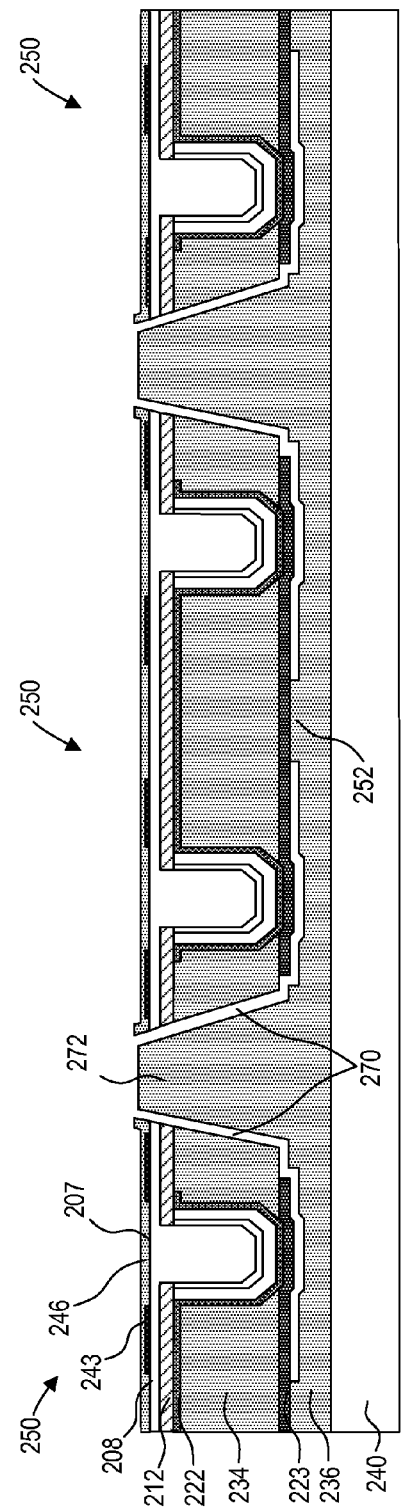

LED DEVICE WITH EMBEDDED NANOWIRE LEDS

BACKGROUND

Field

The present invention relates to nanowire devices. More particularly embodiments of the present invention relate to nanowire LED devices.

Background Information

Light emitting diodes (LEDs) are increasingly being considered as a replacement technology for existing light sources. For example, LEDs are found in signage, traffic signals, automotive tail lights, mobile electronics displays, and televisions. Various benefits of LEDs compared to traditional lighting sources may include increased efficiency, longer lifespan, variable emission spectra, and the ability to be integrated with various form factors.

Conventional planar-type semiconductor-based LEDs are generally patterned from layers grown across a wafer surface. More particularly, planar-type semiconductor-based LEDs include one or more semiconductor-based active layers sandwiched between thicker semiconductor-based cladding layers. More recently bottom-up approaches have been used to form nanowire LED structures that may offer several advantages to the planar-type LEDs, including lower dislocation density, greater light extraction efficiency, and a larger active region surface area relative to substrate surface area.

In one implementation illustrated in FIG. 1 a bulk LED substrate 100 includes a buffer layer 110 grown on a growth substrate 102. A patterned mask layer 112 (e.g. a nitride layer, such as silicon nitride masking layer) is then formed on a surface of the buffer layer 110 to define the bottom interface area for growth of the nanowire cores 114 using a suitable growth technique such as chemical beam epitaxy or vapor phase epitaxy. Thus, the bottom-up formation of each nanowire core 114 may be accomplished using the crystallographic orientation of the underlying buffer layer 110 without the required use of a particle or catalyst, and the width and pitch of the nanowire cores 116 can be defined by lithographic patterning of mask layer 112.

Epitaxial growth conditions for the nanowire cores may be controlled for vertical growth direction. Once the determined height is achieved, epitaxial growth conditions are changed to create a core-shell structure with the active layer 116 and doped shell 118 around the nanowire cores 114. Alternatively, nanowires can be formed using a similar technique using vertical growth conditions for the active layer and both cladding layers resulting in a sandwiched configuration similar to the planar-type LEDs rather than a core-shell structure.

Devices implementing arrays of nanowires are typically packaged in two manners. One includes leaving the array of nanowires on the original growth substrate such as described in U.S. Pat. No. 7,396,696 and U.S Publication No. 2011/0240959. In such implementations, the buffer layer functions as an electric current transporter layer to which a bottom electrode is formed, and a common top electrode is formed over the array of nanowires. Another implementation includes flip chip packaging the arrays of nanowires onto a receiving substrate using solder bumps then removing the growth substrate as described in U.S Publication Nos. 2011/0309382 and 2011/0254034.

SUMMARY OF THE INVENTION

Nanowire devices and methods of forming nanowire devices that are poised for pick up and transfer to a receiving substrate are described. In an embodiment a nanowire device includes a base layer, a plurality of nanowires on an protruding away from a first surface of the base layer in which each nanowire includes a core, a shell, and an active layer between the core and the shell. A patterned mask layer may be formed on the base layer, where the cores of the plurality of nanowires extend through corresponding openings in the patterned mask layer. An encapsulation material laterally surrounds the plurality of nanowires such that the plurality of nanowires is embedded within the encapsulation material. A top electrode layer is formed on a second surface of the base layer opposite the first surface and in electrical contact with the core of each nanowire, and a bottom electrode layer is in electrical contact with the shell of each nanowire.

The bottom and top electrode layers can be formed of a variety of different materials depending upon application. For example, the top electrode layer may be transparent or semi-transparent to the visible wavelength spectrum, while the bottom electrode layer includes a mirror layer. The bottom electrode layer may additional include a bonding layer formed of a noble metal, for example, for controlling adhesion to a stabilization layer or bonding to a receiving substrate. One or more bottom conductive contact can be formed on and surrounding the shells of the plurality of nanowires, with the bottom electrode layer in electrical contact with the one or more bottom conductive contacts. In an embodiment, the bottom electrode layer spans along a bottom surface of the encapsulation material. In an embodiment, the encapsulation material is formed of a thermoset material. The encapsulation material may additional be transparent to the visible wavelength.

In an embodiment, an array of nanowire devices is supported by a stabilization layer on a carrier substrate. In addition, a sacrificial release layer may span between the stabilization layer and the array of nanowire devices. In an embodiment the stabilization layer is formed of a thermoset material. In an embodiment, the stabilization layer includes an array of staging cavities, and the array of nanowire devices is within the array of staging cavities. In an embodiment, the stabilization layer includes an array of stabilization posts, and the array of nanowire devices is supported by the array of stabilization posts. The array of nanowire devices may be supported by the array of stabilization posts in the array of staging cavities. Where each nanowire device includes a bottom electrode layer, the bottom electrode layer may be bonded to a corresponding stabilization post.

A method of forming a nanostructure may include forming an encapsulation material laterally surrounding an array of nanowires and over a handle substrate such that the array of nanowires is embedded within the encapsulation material. An array of mesa trenches is etched through the encapsulation material, where each mesa trench surrounds a plurality of nanowires. A sacrificial release layer is then deposited over the encapsulation material and within the array of mesa trenches. The handle substrate is then bonded to a carrier substrate with a stabilization layer, with the sacrificial release layer between the array of nanowires and the stabilization layer. The handle substrate is then removed. Forming the encapsulation material laterally surrounding the array of nanowires and over the handle substrate may additionally include coating a first thermosetting material layer over the array of nanowires and reducing a thickness of the first thermosetting material layer to expose a bottom conductive contact on each of the nanowires. A bottom electrode may then be deposited on the bottom conductive contact of each of the nanowires. Bonding of the handle substrate to the carrier substrate with the stabilization layer may additionally include coating a second thermosetting material over the sacrificial release layer, and curing the second thermosetting material. In an embodiment, the sacrificial release layer may be etched using a vapor or plasma etching technique to remove the sacrificial release layer from between the array of nanowires and the stabilization layer, resulting in a nanostructure including an array of nanowire devices that is poised for pick up and transfer to a receiving substrate.

BRIEF DESCRIPTION OF THE DRAWINGS

FIG. 13 is a cross-sectional side view illustration of an array of nanowire devices retained in a stabilization layer after partial removal of a top electrode layer in accordance with an embodiment of the invention.

FIG. 14 is a cross-sectional side view illustration of an array of nanowire devices within an array of staging cavities in a stabilization layer after removal of a sacrificial release layer in accordance with an embodiment of the invention.

DETAILED DESCRIPTION OF THE INVENTION

Figure 1:
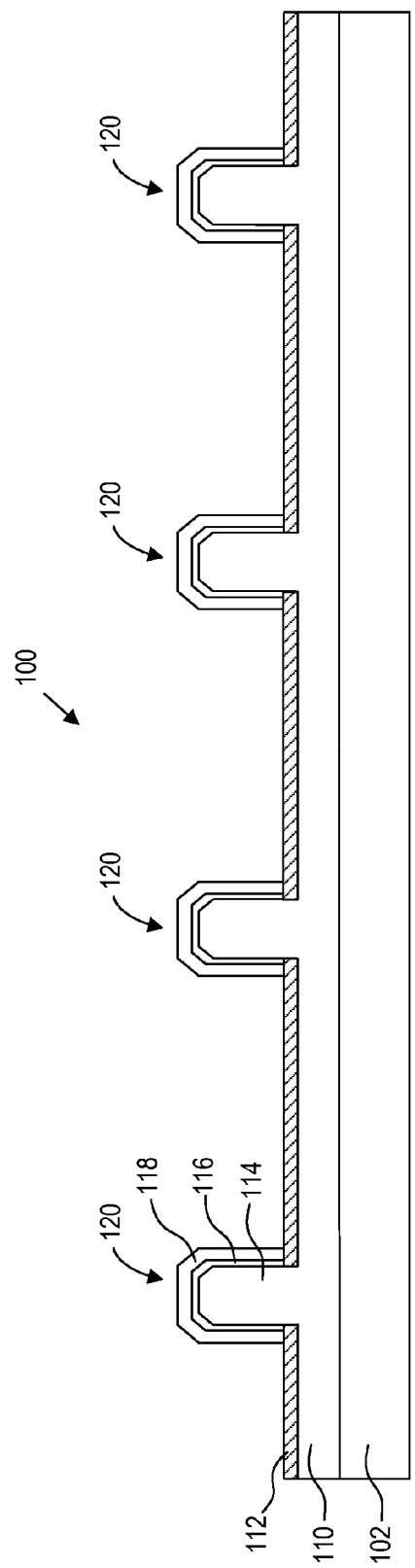
FIG. 1 is a cross-sectional side view illustration of a bulk LED substrate including an array of nanowires formed over a buffer layer.

Embodiments of the present invention describe nanowire devices. For example, an array of nanowires may be grown on a base layer and bonded to a carrier substrate with a stabilization layer where the bonded structure is further processed to form an array of nanowire devices that is poised for pick up and transfer to a receiving substrate. Each nanowire device includes an encapsulation layer material that laterally surrounds a plurality of nanowires in the nanowire device, such that the plurality of nanowires is embedded within the encapsulation material. In this manner, the encapsulation material can distribute loads exerted on the individual nanowires in the nanowire device during transfer and bonding operations and preserve the integrity of the individual nanowires. The encapsulation layer material may additionally provide a surface for the formation of a single bottom electrode in electrical connection with the plurality of nanowires in the nanowire device.

While some embodiments of the present invention are described with specific regard to nanowire LED devices, it is to be appreciated that embodiments of the invention are not so limited and that certain embodiments may also be applicable to other nanowire based semiconductor devices such as field effect transistors (FETs), diodes, solar cells, and detectors where a base layer is used as a seed for growing the nanowires or may serve as an electric current transporter layer.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning," "over" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments of the invention describe nanowire devices including a nanowire protruding away from a base layer. For example, the nanowire may comprise a core-shell configuration. Since the active area of the nanowire is determined by the length of the wire, which is orthogonal to the surface of the base layer from which it protrudes, the amount of active area can be increased relative to the available horizontal area of the base layer, particularly when a plurality of nanowires protrude away from the base layer. Furthermore, nanowire device configurations in accordance with embodiments of the invention can be used to achieve specific effective current densities through the nanowire devices, with the effective current density being proportional to the number of nanowires protruding from the base layer, and LED junction (e.g. quantum well) surface area for the nanowires. For example, highest effective current densities may be achieved with a single nanowire protruding from the base layer. Effective current densities can be reduced by increasing the number of nanowires in a nanowire device. In accordance with embodiments of the invention, the number of nanowires in a nanowire device can be adjusted to achieve a desired effective current density that correlates to a specific efficiency of the device, particularly at low operating currents (e.g. scale of milli-amperes and lower) and effective current densities (e.g. scale of amperes per square centimeter and lower) for the nanowire devices below a characteristic "efficiency droop" where a gradual increase in effective current density may result in a significant increase in efficiency of the nanowire device.

In another aspect, embodiments of the invention describe a nanowire device integration design in which a nanowire device is transferred from a carrier substrate and bonded to a receiving substrate using an electrostatic transfer head assembly. In accordance with embodiments of the present invention, a pull-in voltage is applied to an electrostatic transfer head in order to generate a grip pressure on a nanowire device and pick up the nanowire device. It has been observed that it can be difficult to impossible to generate sufficient grip pressure to pick up devices with vacuum chucking equipment when device sizes are reduced below a specific critical dimension of the vacuum chucking equipment, such as approximately 300 μm or less, or more specifically approximately 100 μm or less. Furthermore, electrostatic transfer heads in accordance with embodiments of the invention can be used to create grip pressures much larger than the 1 atm of pressure associated with vacuum chucking equipment. For example, grip pressures of 2 atm or greater, or even 20 atm or greater may be used in accordance with embodiments of the invention. Accordingly, in one aspect, embodiments of the invention provide the ability to transfer and integrate nanowires into applications in which integration was previously not possible by using an electrostatic transfer head assembly to transfer and integrate nanowires devices that include nanowires fabricated on the nano-scale that protrude from a base layer fabricated with a larger dimension, such as on the micro-scale. In accordance with embodiments of the invention a top surface of the base layer opposite a bottom surface of the base layer from which the nanowire protrudes can be used as a contact area for an electrostatic transfer head of an electrostatic transfer head assembly to contact the nanowire device. For example, each electrostatic transfer head may be fabricated at a similar scale as the top surface of the base layer for a corresponding nanowires device.

In some embodiments, the term "micro" structure or scale as used herein may refer to the descriptive size, e.g. width, of certain devices or structures. In some embodiments, "micro" structure or scale may be on the scale of 1 μm to approximately 300 μm, or 100 μm or less in many applications. For example, a base layer of a nanowire device or electrostatic transfer head may have a contact surface characterized by a maximum dimension (e.g. width) at the micro scale. However, it is to be appreciated that embodiments of the present invention are not necessarily so limited, and that certain aspects of the embodiments may be applicable to larger micro structure or scale, and possibly smaller size scales. In some embodiments, the term "nano" structure or scale as used herein may refer to the descriptive size, e.g. length or width, of certain devices or structures. In some embodiments, "nano" structure or scale may be on the scale of less than 1 μm. For example, a maximum width of a nanowire may be of the nano scale. However, it is to be appreciated that embodiments of the present invention are not necessarily so limited, and that certain aspects of the embodiments may be applicable to larger nano structure or scale.

In another aspect, embodiments of the invention describe a structure for stabilizing an array of nanowires devices on a carrier substrate so that they are poised for pick up and transfer to a receiving substrate. In some embodiments, the array of nanowires devices is adhesively bonded to an array of stabilization posts in a stabilization layer. In accordance with embodiments of the invention, the minimum amount pick up pressure required to pick up a nanowire device from a stabilization post can be determined by the adhesion strength between an adhesive bonding material from which the stabilization layer is formed and the nanowire device. In some embodiments this may be determined by the contact area between the bottom electrode on each nanowire device and a corresponding stabilization post. For example, adhesion strength which must be overcome to pick up a nanowire device is related to the minimum pick up pressure generated by a transfer head as provided in equation (1):

$$P_1 A_1 = P_2 A_2 \qquad (1)$$

where $P_1$ is the minimum grip pressure required to be generated by a transfer head, $A_1$ is the contact area between a transfer head contact surface and nanowire device contact surface, $A_2$ is the contact area between the bottom electrode for a nanowire device and the stabilization post, and $P_2$ is the adhesion strength of the stabilization post to the bottom electrode. In an embodiment, a grip pressure of greater than 1 atmosphere is generated by a transfer head. For example, each transfer head may generate a grip pressure of 2 atmospheres or greater, or even 20 atmospheres or greater without shorting due to dielectric breakdown of the transfer heads. In some embodiments, due to the smaller area, a higher pressure is realized at the contact area between the bottom electrode on each nanowire and the stabilization post than the grip pressure generate by a transfer head. In accordance with some embodiments of the invention, the adhesion between the nanowires devices and the stabilization posts is controlled by the contact area of the bottom electrode with the stabilization post, as well as materials selection for bonding the bottom electrode to the stabilization post.

Figure 2A:
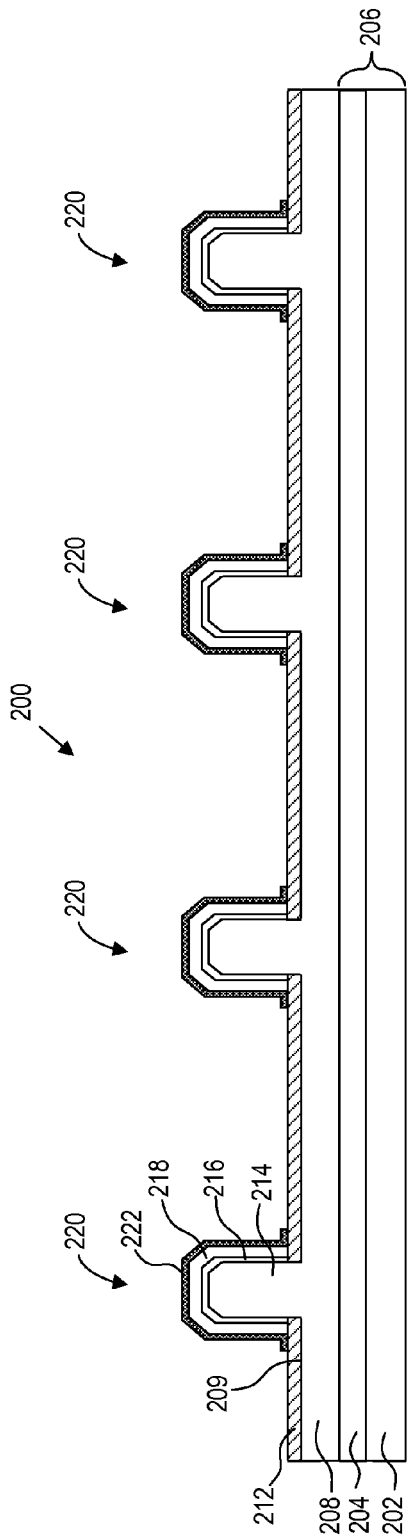
FIG. 2A is a cross-sectional side view illustration of an array of bottom conductive contacts formed over a bulk LED substrate including an array of nanowires in accordance with an embodiment of the invention.

FIG. 2A is a cross-sectional side view illustration of an array of bottom conductive contacts formed over a bulk LED substrate including an array of nanowires in accordance with an embodiment of the invention. As shown the bulk LED substrate 200 may include a handle substrate 206, a base layer 208 grown upon the handle substrate 206, and an array of nanowires 220 formed on and protruding away from surface 209 of the base layer 208 and through an array of openings formed in a masking layer 212 formed on the surface 209. Each nanowire 220 includes a core 214, a shell 218, and an active layer 216 between the core and the shell. In an embodiment, the masking layer 212 may be formed of a nitride (e.g. $SiN_x$) material, and patterned using lithographic techniques to form openings through which each core 214 protrudes. The core and shell may have opposite doping. For example, an n-doped core 214 may be surrounded by a p-doped shell 218, or a p-doped core may be surrounded by an n-doped shell. Active layer 216 may include one or more layers, for example, one or more quantum well layers separated by barrier layers. As illustrated in FIG. 2A, an bottom conductive contact 222 is formed on the shell 218. In an embodiment, the bottom conductive contact 222 may form a shell around shell 218. For example, the bottom conductive contact 222 may be formed adjacent portions of shell 218 that are adjacent the active layer 216. This may increase emission uniformity along surfaces of the nanowires 220.

Each nanowire 220 may be formed of a variety of compound semiconductors having a bandgap corresponding to a specific region in the spectrum. For example, the nanowires illustrated in FIG. 2A may be designed for emission of red light (e.g. 620-750 nm wavelength), green light (e.g. 495-570 nm wavelength), blue light (e.g. 450-495 nm wavelength), or other wavelengths such as yellow, orange, or infra-red. In the following description exemplary processing sequences are described for forming an array of nanowire LED devices with core-shell configurations based upon GaN materials. While the primary processing sequences are described for specific materials, it is to be understood that the exemplary processing sequences can be used for fabricating nanowires with different emission spectra, and that certain modifications are contemplated, particularly when processing different materials. For example, it is contemplated that the core 214 and shell 218 can include one or more layers based on II-VI materials (e.g. ZnSe) or III-V materials including III-V nitride materials (e.g. GaN, AN, InN, InGaN, and their alloys) and III-V phosphide materials (e.g. GaP, AlGaInP, and their alloys). The handle substrate 206 may include a growth substrate formed of any suitable material such as, but not limited to, silicon, SiC, GaAs, GaN, and sapphire.

Figure 2B:
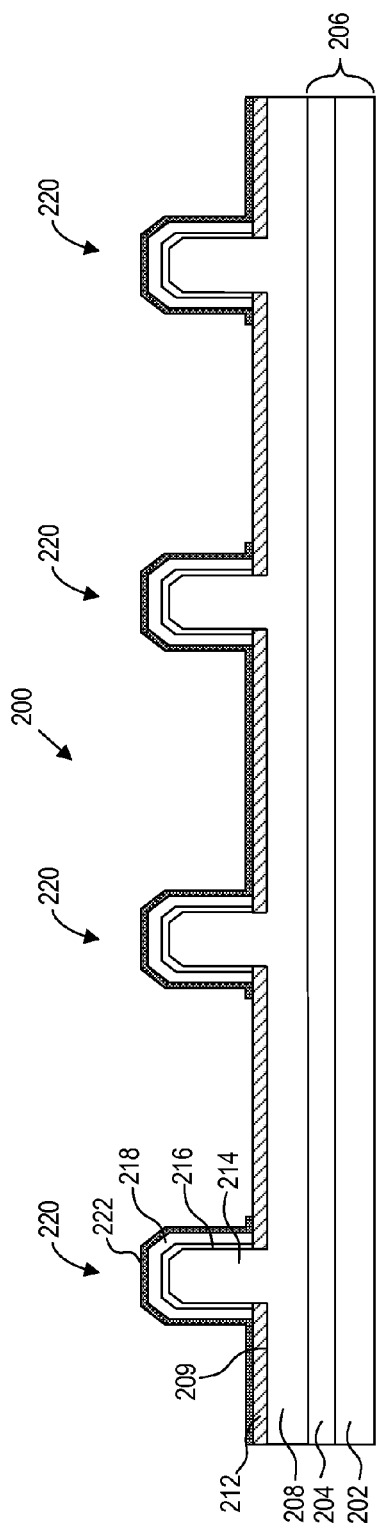
FIG. 2B is a cross-sectional side view illustration of an array of bottom conductive contacts formed over a bulk LED substrate including an array of nanowires in accordance with an embodiment of the invention.

Referring to FIGS. 2A-2B, in an embodiment, the bulk LED substrate 200 includes a handle substrate 206 that includes a growth substrate 202 formed of sapphire, and may be approximately 200 µm thick. A buffer layer 204 formed of GaN is grown upon the growth substrate 202 to a thickness of approximately 0.5 µm to 5 µm. Following the formation of the buffer layer 204, a base layer 208 is grown upon the buffer layer 204. In an embodiment, the base layer 208 is doped similarly as the core 214 to reduce defects during growth of the core 214, as well as to provide an electrical connection. For example, the base layer 208 and core 214 may be an n-doped GaN material. In an embodiment, the base layer 208 is approximately 1 µm thick, and the core 214 is approximately 1 µm-5 µm tall and has a width of up to 1 µm, such as 0.2 µm-1 µm. In an embodiment, core 214 is selectively grown in a vertical direction along c-plane growth of the underlying GaN base layer 208.

In an embodiment, a pitch from center to center between adjacent cores 106 is sufficient to allocate enough space to perform lithographic patterning techniques such as a photoresist lift-off technique for forming the bottom conductive contacts 222, or the formation of mesa trenches. In an embodiment, the pitch is approximately 1 µm or more, for example, approximately 2.5 µm. Following the formation of core 214, growth conditions are modified to accomplish lateral growth, such as m-plane growth, in addition to continuing vertical growth to form active layer 216 and shell layer 218. Active layer 216 may include one or more quantum well and barrier layers. Shell layer 218 may have the opposite doping than core 214. For example, where core 214 is n-doped, the shell layer 218 is p-doped. In an embodiment, shell layer 218 has a thickness of 0.1 µm-0.5 µm. In an embodiment, both are formed of GaN. In an embodiment, each nanowire 220 may conform to a hexagonal configuration when viewed from above, corresponding to m-plane growth.

A variety of configurations are possible for the bottom conductive contacts 222. In an embodiment illustrated in FIG. 2A, a bottom conductive contact 222 is formed over each nanowire 220. In such an embodiment, the bottom conductive contact 222 may also be partially formed on the masking layer 212 and only partially span between adjacent nanowires 220. In an embodiment illustrated in FIG. 2B, a plurality of nanowires 220 may share a single bottom conductive contact 222. In such an embodiment, the bottom conductive contact 222 may also be formed on the masking layer 212 and completely span between adjacent nanowires 220.

Bottom conductive contacts 222 may be formed using a variety of deposition methods, such as evaporation or sputtering. Patterning of bottom conductive contacts 222 may be formed by blanket deposition followed by lithography and etching, or the bottom conductive contacts 222 may be formed using a photoresist lift-off technique. In an embodiment, a center-to-center spacing between adjacent nanowires 220 is maintained in order to allow sufficient room for patterning the photoresist for a photoresist lift-off technique.

Bottom conductive contacts 222 may be formed of a variety of conductive materials including metals, conductive oxides, and conductive polymers. In an embodiment, bottom conductive contacts 222 are formed of a transparent conductive oxide such as ITO. After forming the bottom conductive contacts 222, the structure is annealed to form an ohmic contact between the bottom conductive contacts 222 and shell 218.

Figure 3:
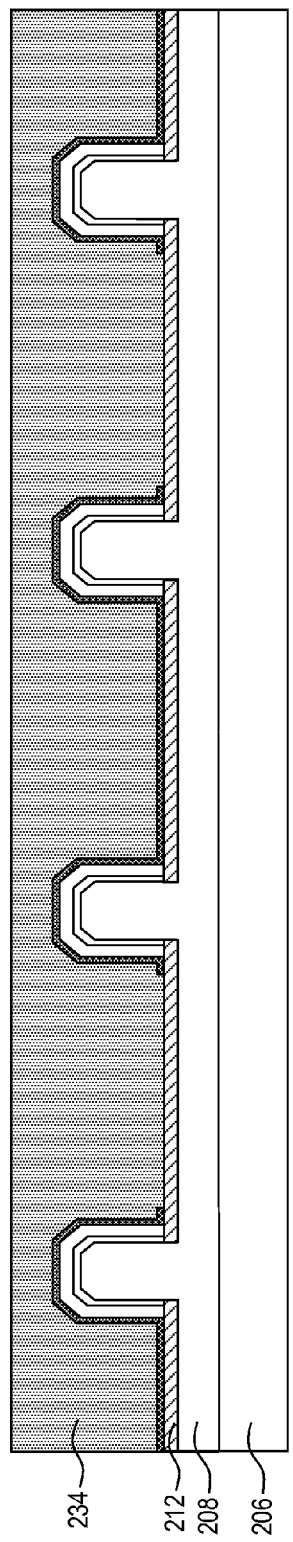
FIG. 3 is a cross-sectional side view illustration of coating an encapsulation material layer over an array of nanowires in accordance with an embodiment of the invention.
Figure 4:
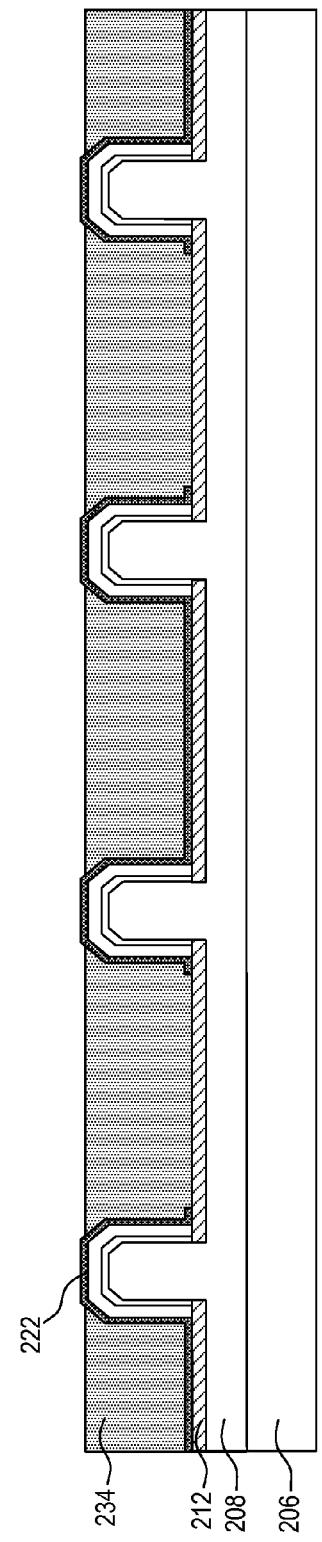
FIG. 4 is a cross-sectional side view illustration of reducing a thickness of the encapsulation material layer of FIG. 3 to expose a bottom conductive contact on each nanowire in accordance with an embodiment of the invention.

Referring now to FIG. 3 an encapsulation material layer 234 is coated over the array of nanowires in accordance with an embodiment of the invention. As illustrated the encapsulation material layer 234 laterally surrounds the plurality of nanowires so that the nanowires are embedded within the encapsulation material. The encapsulation material layer 234 may be formed of a variety of materials that can provide structural stability to the nanowires. In some embodiments, the encapsulation material layer 234 is formed of a material that is transparent to the visible spectrum, and allows for the transmission of light emitted from the individual nanowires 220. In an embodiment, encapsulation material layer 234 is formed of a thermosetting material, for example, a thermosetting material associated with 10% or less volume shrinkage during curing, or more particularly about 6% or less volume shrinkage during curing so as to not delaminate or induce excessive stress on the nanowires. Exemplary thermosetting materials include benzocyclobutene (BCB) and epoxy. In an embodiment, the encapsulation material layer 234 is spin coated or spray coated over the array of nanowires. Following application of the encapsulation material layer 234, it is partially cured, followed by etch-back as illustrated in FIG. 4 to expose the one or more bottom conductive contacts 222 on the plurality of nanowires 220 for each nanowire device to be formed. For example, etch-back may be performed using a dry etch technique after partially curing the encapsulation material layer 234. In the particular embodiment illustrated, a bottom conductive contact 222 is shared by a plurality of nanowires. In other embodiments, each a separate bottom conductive contact 222 is formed over each nanowire. Etch-back may at least partially attack the exposed bottom conductive contacts 222. In an embodiment, the bottom conductive contacts 222 are not completely etched through during etch back so as to preserve ohmic contact shells surrounding the nanowires 220.

Figure 5:
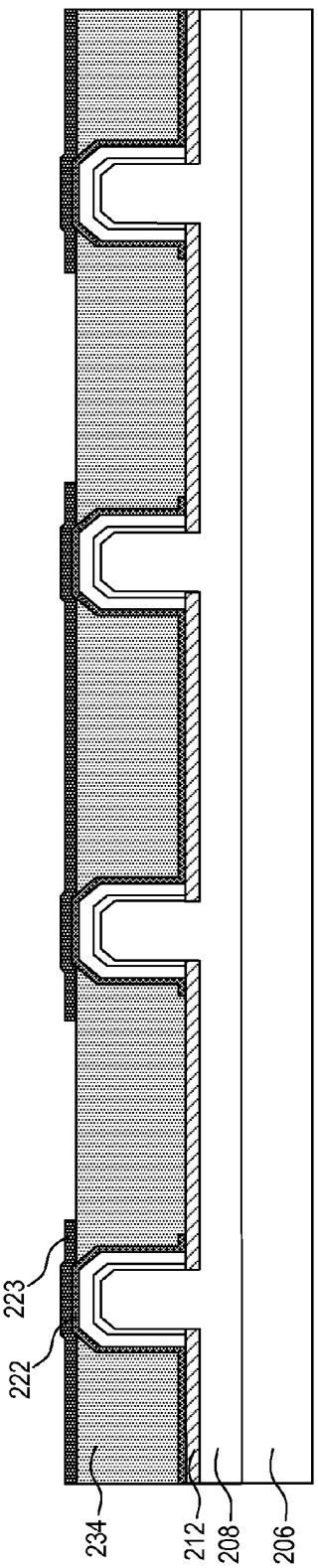
FIG. 5 is a cross-sectional side view illustration of an array of bottom electrodes formed over an array of nanowires in accordance with an embodiment of the invention.

Referring now to FIG. 5, an array of bottom electrodes 223 are formed over the array of nanowires 220. As illustrated, the bottom electrodes 223 span along a bottom surface of the encapsulation material layer 234 and are in electrical contact with the one or more bottom conductive contacts 222. Bottom electrodes 223 may be formed of a variety of electrically conductive materials including metals, conductive oxides, and conductive polymers. The bottom electrodes 223 may be formed of a single layer, or a layer stack. Bottom electrodes 223 may be transparent to the visible wavelength spectrum. Bottom electrodes 223 may include a mirror layer that is reflective the wavelength emitted by the nanowires 220.

In an embodiment, bottom electrode 223 is formed of a transparent conductive oxide such as ITO. In an embodiment, bottom electrode 223 is formed of a metallic material such as palladium, or NiAu. In an embodiment, the bottom electrode 223 includes a mirror layer to reflect the emitted wavelength from the nanowire. For example, a gold, aluminum, or silver mirror layer may be suitable for reflecting the red wavelength spectrum, while a silver or aluminum mirror layer may be suitable for reflecting the blue or green wavelength spectrum. In an embodiment, the bottom electrode includes a bonding layer to control adhesion strength with the stabilization layer. For example, a noble metal such as gold may be used where the stabilization layer is formed of benzocyclobutene (BCB). A number of configurations are possible. Accordingly, the bottom electrode may be a single layer or a layer stack in accordance with embodiments of the invention.

Figure 6:
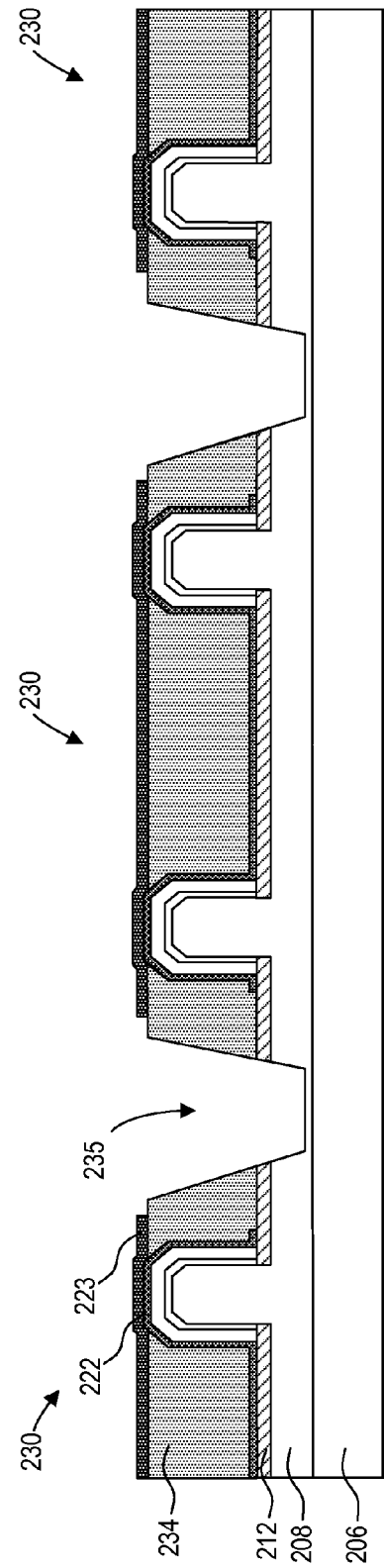
FIG. 6 is a cross-sectional side view illustration of an array of mesa trenches formed through an encapsulation material layer in accordance with an embodiment of the invention.

An array of mesa trenches 235 is formed through the encapsulation material layer 234 so that each mesa trench laterally surrounds a plurality of nanowires as illustrated in FIG. 6. As shown in FIG. 6, the mesa trenches 235 extend through the masking layer 212 and into the base layer 208 to form an array of mesa structures 230 separated by the array of mesa trenches 235 over the handle substrate 206. In an embodiment, after forming the mesa trenches 235, the substrate stack may be annealed to cure the encapsulation material layer 234.

Mesa trenches 235 extend at least partially into the base layer 208 to define mesa structures 230. For example, in an embodiment mesa trenches 235 extend partially into an n-doped GaN base layer 208, but do not extend into an underlying GaN buffer layer 204. In another exemplary embodiment, mesa trenches 235 extend completely through an n-doped GaN base layer 208 and partially or completely through an underlying GaN buffer layer 204.

In accordance with embodiments of the invention, the base layer 208 for each mesa structure 230, and corresponding nanowire device 250 to be formed may be formed on the micro scale. For example, referring to the nanowire devices illustrated in FIG. 15, each base layer 208 may have a top surface 207 characterized by a maximum length or width of 300 µm or less, or more particularly 100 µm or less. In an embodiment, each base layer 208 has a top surface 207 characterized by a maximum length or width of 1 to 20 µm.

Etching of the mesa trenches 235 may be wet or dry depending upon the desired angles for sidewalls of the mesa trenches 235. In an embodiment, dry etching techniques such as reactive ion etching (RIE), electro-cyclotron resonance (ECR), inductively coupled plasma reactive ion etching (ICP-RIE), and chemically assisted ion-beam etching (CAIBE) may be used. The etching chemistries may be halogen based, containing species such as $Cl_2$, $BCl_3$, or $SiCl_4$.

Figure 7:
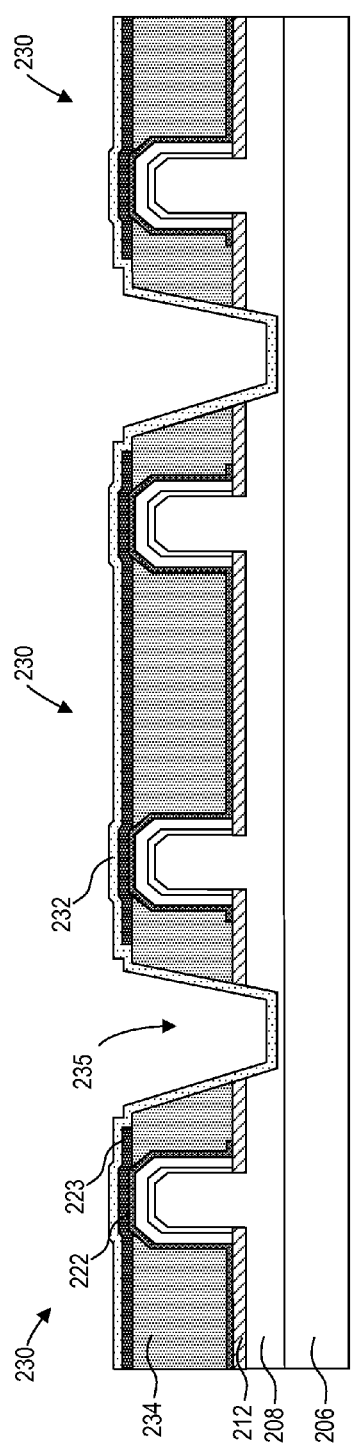
FIG. 7 is a cross-sectional side view illustration of a sacrificial release layer formed over the array of nanowires and array of bottom electrodes, and within the array of mesa trenches in accordance with an embodiment of the invention.

A sacrificial release layer 232 may then be formed over the array of mesa structures 230 as illustrated in FIG. 7. In an embodiment, the sacrificial release layer 232 is formed of a material which can be readily and selectively removed with vapor (e.g. vapor HF) or plasma etching. In an embodiment, the sacrificial release layer is formed of an oxide (e.g. $SiO_2$) or nitride (e.g. $SiN_x$), with a thickness of 0.2 µm to 2 µm. In an embodiment, the sacrificial release layer is formed using a comparatively low quality film formation technique such as sputtering, low temperature plasma enhanced chemical deposition (PECVD), or electron beam evaporation. In an embodiment, masking layer 212 is formed of a nitride (e.g. $SiN_x$) and sacrificial release layer 232 is formed of an oxide (e.g. $SiO_2$).

Figure 8:
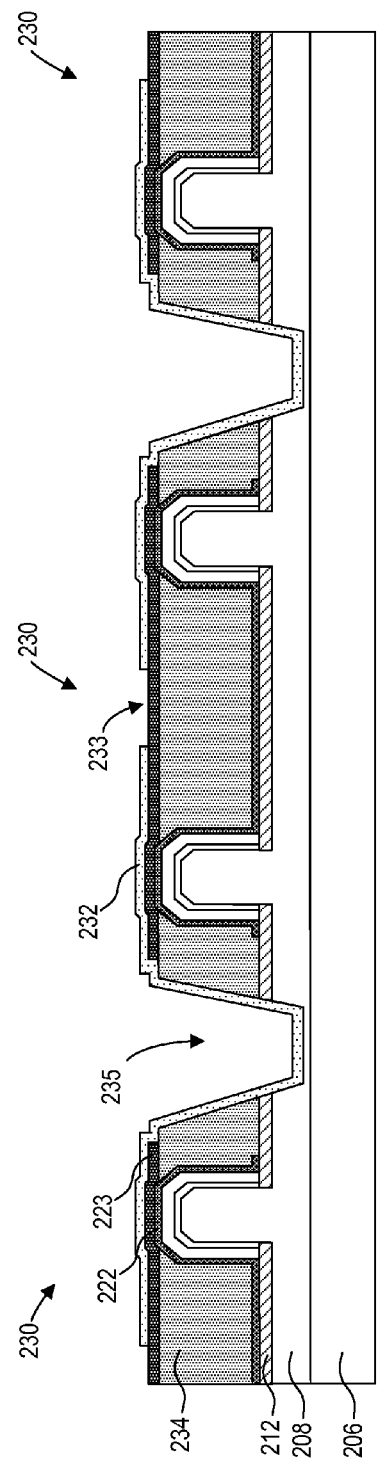
FIG. 8 is a cross-sectional side view illustration of an array of openings formed in the sacrificial release layer in accordance with an embodiment of the invention.

As illustrated in FIG. 8, an array of openings 233 are etched through the sacrificial release layer 232 to expose the bottom electrode 223 for each mesa structure 230. As will become more apparent in the following description, the width of openings 233 and thickness of the sacrificial release layer 232 may all contribute to the dimensions the stabilization posts following the formation of the stabilization layer.

Figure 9:
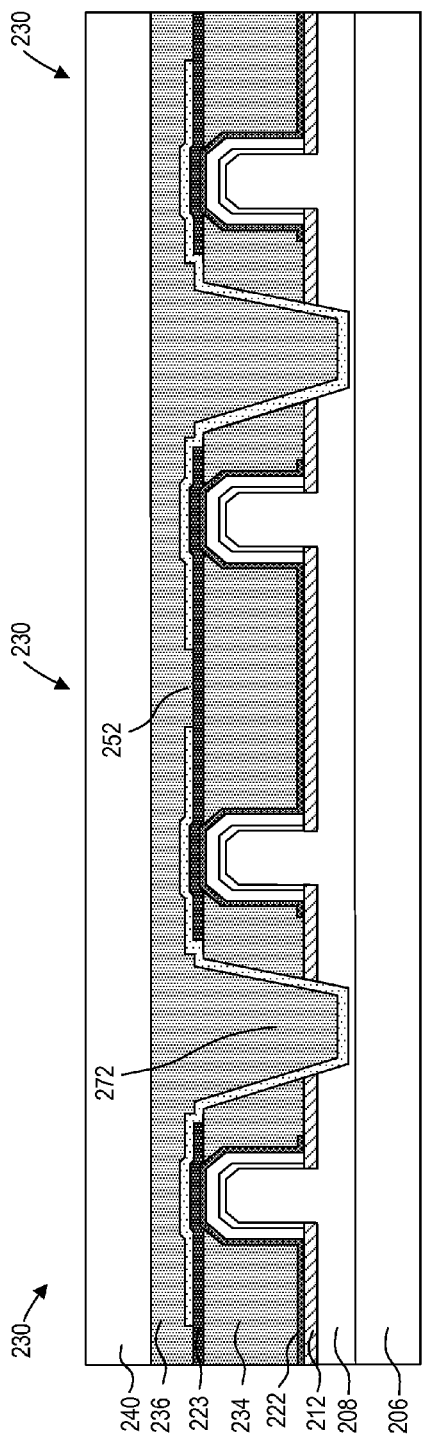
FIG. 9 is a cross-sectional side view illustration of a handle substrate bonded to a carrier substrate with a stabilization layer in accordance with an embodiment of the invention.

Referring now to FIG. 9, in an embodiment a stabilization layer 236 is formed over the sacrificial release layer 232 and bonded to a carrier substrate 240. In accordance with embodiments of the invention, stabilization layer 236 may be formed of an adhesive bonding material. In an embodiment the adhesive bonding material is a thermosetting material such as benzocyclobutene (BCB) or epoxy.

In an embodiment, stabilization layer 236 is spin coated or spray coated over the sacrificial release layer 232, though other application techniques may be used. Following application of the stabilization layer 236, the stabilization layer may be pre-baked to remove the solvents. After pre-baking the stabilization layer 236 the handle wafer 206 is bonded to the carrier substrate 240 with the stabilization layer 236. In an embodiment, bonding includes curing the stabilization layer 236. Where the stabilization layer 236 is formed of BCB, curing temperatures should not exceed approximately 350° C., which represents the temperature at which BCB begins to degrade. Achieving a 100% full cure of the stabilization layer may not be required in accordance with embodiments of the invention. In an embodiment, stabilization layer 236 is cured to a sufficient curing percentage (e.g. 70% or greater for BCB) at which point the stabilization layer 236 will no longer reflow. Moreover, it has been observed that partially cured BCB may possess sufficient adhesion strengths with carrier substrate 240 and the sacrificial release layer 232. In an embodiment, stabilization layer may be sufficiently cured to sufficiently resist being etched during the sacrificial release layer release operation.

As illustrated, the stabilization layer 236 fills the mesa trenches 235 to form staging cavity sidewalls 272, and fills openings 233 within the sacrificial release layer 232 to form stabilization posts 252. Stabilization posts 252, may have a maximum width that is less than the maximum width of the base layer 208 for a corresponding nanowire device 250. For example, an exemplary nanowire device 250 including a 10 μm×10 μm wide base layer may be supported by a 1 μm×1 μm wide stabilization post or 2 μm×2 μm wide stabilization post. However, it is to be appreciated that these dimensions are exemplary, and a number of configurations are possible.

Figure 10:
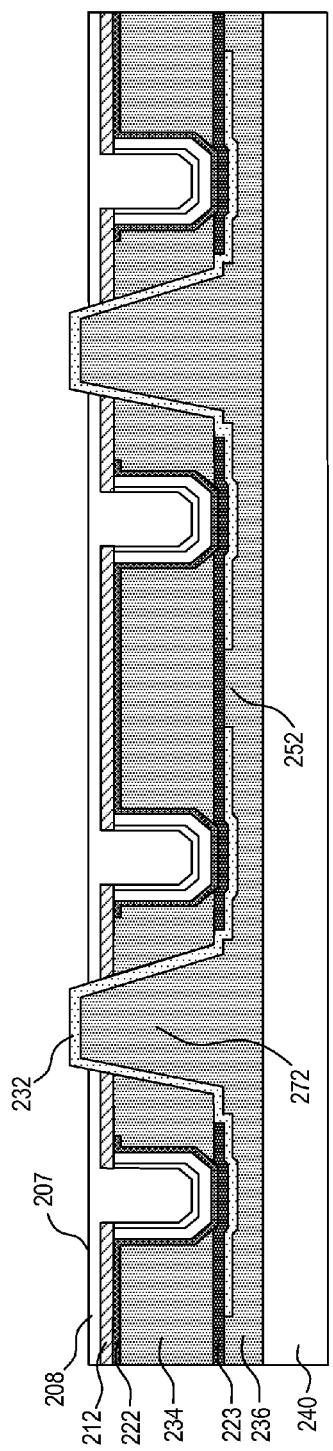
FIG. 10 is a cross-sectional side view illustration of an array of nanowire mesa structures after removal of a handle substrate in accordance with an embodiment of the invention.

Following bonding of the handle substrate 206 to the carrier substrate 240, the handle substrate 206 is removed as illustrated in FIG. 10. Removal of handle substrate 206 may be accomplished by a variety of methods including laser lift off (LLO), grinding, and etching depending upon the material selection of the growth substrate 202, and optional etch stop layer 205 or buffer layer 204. Upon removal of the handle substrate 206, portions of the sacrificial release layer 232 may protrude above an exposed top surface of the base layer 208 for each of the mesa structures 230. Alternatively, the base layer 208 may be thinned after removal of the handle substrate, resulting in portions of the sacrificial release layer 232 protruding above an exposed top surface of the thinned base layer 208.

In an embodiment where the handle substrate 206 includes a growth substrate 202 formed of sapphire, removal may be accomplished using LLO in which a 202/204 interface is irradiated with an ultraviolet laser such as a Nd-YAG laser or KrF excimer laser. Absorption in the GaN buffer layer 204 at the interface with the transparent growth substrate 202 results in localized heating of the interface resulting in decomposition at the interfacial GaN to liquid Ga metal and nitrogen gas. Once the desired area has been irradiated, the transparent sapphire growth substrate 202 can be removed by remelting the Ga on a hotplate. Following removal of the growth substrate, the GaN buffer layer 204 can be removed resulting a desired thickness for base layer 208. Removal of buffer layer 204 can be performed using any of the suitable dry etching techniques described above with regard to mesa trenches 235, as well as with CMP or a combination of both.

Figure 11:
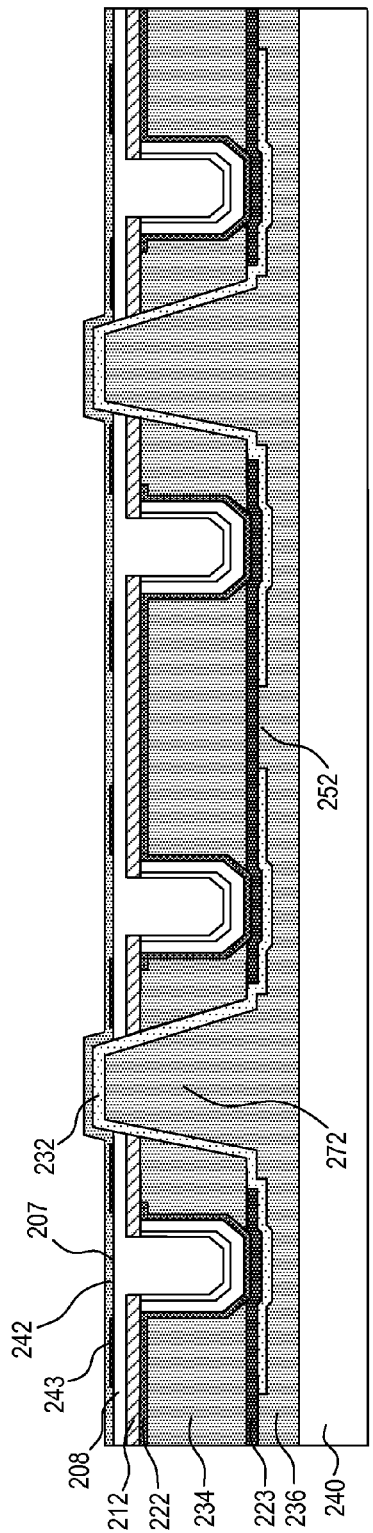
FIG. 11 is a cross-sectional side view illustration of a top electrode layer formed over an array of nanowire mesa structures in accordance with an embodiment of the invention.

Referring now to FIG. 11, following the removal of the handle substrate 206 a top electrode layer 242 may be formed over the top surface 207 of the base layers 208. In some embodiments, prior to forming the top electrode layer 242 an ohmic contact layer 243 can optionally be formed to make ohmic contact with the base layer 208. In an embodiment, ohmic contact layer 243 may be a metallic layer. In an embodiment, ohmic contact layer 243 is a thin GeAu layer for a GaAs or AlGaInP system. In an embodiment, ohmic contact layer 243 is a thin NiAu or NiAl layer for a GaN system. For example, the ohmic contact layer 243 may be 50 angstroms thick. In the particular embodiment illustrated, the ohmic contact layer 243 is not formed directly over the nanowires 220. For example, a metallic ohmic contact layer could potentially reduce light emission. Referring briefly to the top-bottom schematic view illustration in FIG. 15, in an embodiment the ohmic contact layers 243 form rings around, or otherwise form a grid laterally surrounding the nanowires 220.

Top electrode layer 242 may be formed of a variety of electrically conductive materials including metals, conductive oxides, and conductive polymers. In an embodiment, electrode layer 242 is formed using a suitable technique such as evaporation or sputtering. In an embodiment, electrode layer 242 is formed of a transparent electrode material. Electrode layer 242 may also be a transparent conductive oxide (TCO) such as indium-tin-oxide (ITO). Electrode layer 242 can also be a combination of one or more metal layers and a conductive oxide. In an embodiment, electrode layer 242 is approximately 600 angstroms thick ITO. In an embodiment, after forming the electrode layer 242, the substrate stack is annealed to generate an ohmic contact between the electrode layer and the top surfaces 207 of the array of mesa structures 230. Where the encapsulation material layer 234 and stabilization layer 236 are formed of BCB, the annealing temperature may be below approximately 350° C., at which point BCB degrades. In an embodiment, annealing is performed between 200° C. and 350° C., or more particularly at approximately 320° C. for approximately 10 minutes.

Figure 12:
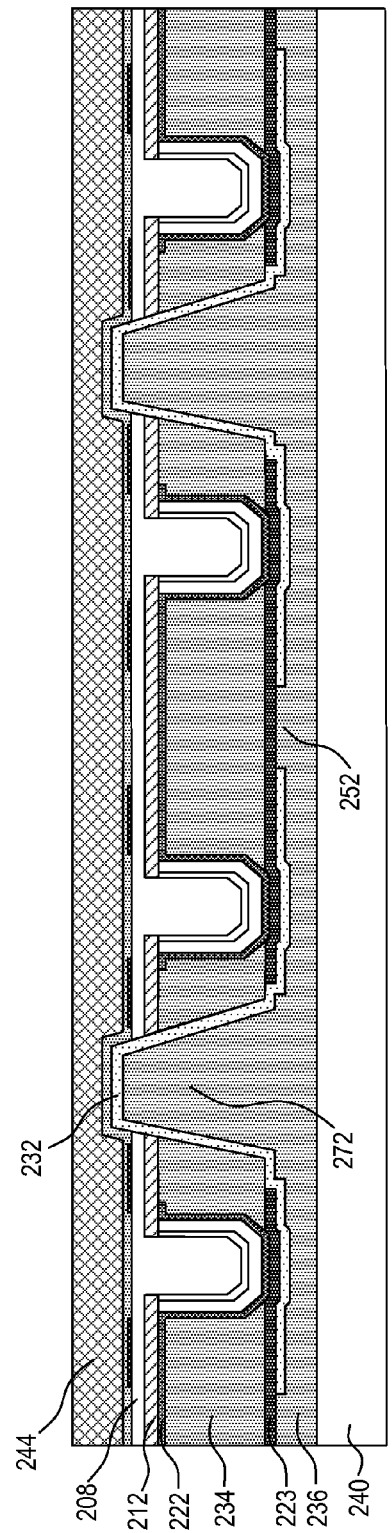
FIG. 12 is a cross-sectional side view illustration of a patterning layer formed over a top electrode layer formed over an array of nanowire mesa structures in accordance with an embodiment of the invention.

Referring now to FIG. 12, in an embodiment a patterning layer such as a photoresist is applied over the top electrode layer 242. In an embodiment, a photoresist layer 244 is spun on such that a top surface of the photoresist layer 244 fully covers raised portions of electrode layer 242 at the filled mesa trench 235 locations. Referring now to FIG. 13, in an embodiment, the photoresist layer 244 is stripped using a suitable wet solvent or plasma ashing technique until the electrode layer 242 is removed over the filled mesa trench 235 locations, exposing the sacrificial release layer 232 between the mesa structures, resulting in the formation of an array of top electrodes 246. Any remaining photoresist layer 244 may then be fully stripped, resulting in an array of laterally separate nanowire devices 250 embedded in a sacrificial release layer 232 and supported by an array of stabilization posts 252. At this point, the resultant structure still robust for handling and cleaning operations to prepare the substrate for subsequent sacrificial release layer removal and electrostatic pick up.

Still referring to FIG. 13, the top electrodes 246 on each nanowire device 250 cover substantially the entire top surface 207 of each base layer 208 for each nanowire device 250. In such a configuration, the top electrodes 246 cover substantially the maximum available surface area to provide a large, planar surface for contact with the electrostatic transfer head, as described in more detail in FIGS. 16A-16E. This may allow for some alignment tolerance of the electrostatic transfer head assembly.

Following the formation of discrete and laterally separate nanowire devices 250, the sacrificial release layer 232 may be removed. FIG. 14 is a cross-sectional side view illustration of an array of nanowire devices 250 within a stabilization layer after removal of the sacrificial release layer in accordance with embodiments of the invention. A suitable etching chemistry such as HF vapor, or $CF_4$ or $SF_6$ plasma may used to etch the $SiO_2$ or $SiN_x$ sacrificial release layer 232. In the embodiments illustrated, sacrificial release layer 232 is completely resulting in each each nanowire device 250 being supported by a stabilization post 252 within a staging cavity 270. In such an embodiment, adhesion between the nanowire devices and the stabilization posts 242 may be controlled by the contact area of the bottom electrode 223 with the stabilization post 252, as well as materials selection for bonding the bottom electrode and stabilization layer. For example, a bonding layer such gold in a bottom electrode 223 layer stack may be in direct contact with the stabilization post 252. In this manner, the surface area and profile of the surface area where the bottom electrodes 223 are in contact with the stabilization posts 252 is partly responsible for retaining the nanowire devices 250 in place within the stabilization layer, and also contributes the adhesion forces that must be overcome in order to pick up the nanowire devices 250 from the carrier substrate. Staging cavity sidewalls 272 may additionally aid in keeping the array of nanowire devices 250 in place should an adhesive bond be broken between any of the nanowire devices 250 and the stabilization posts 252.

Figure 15:
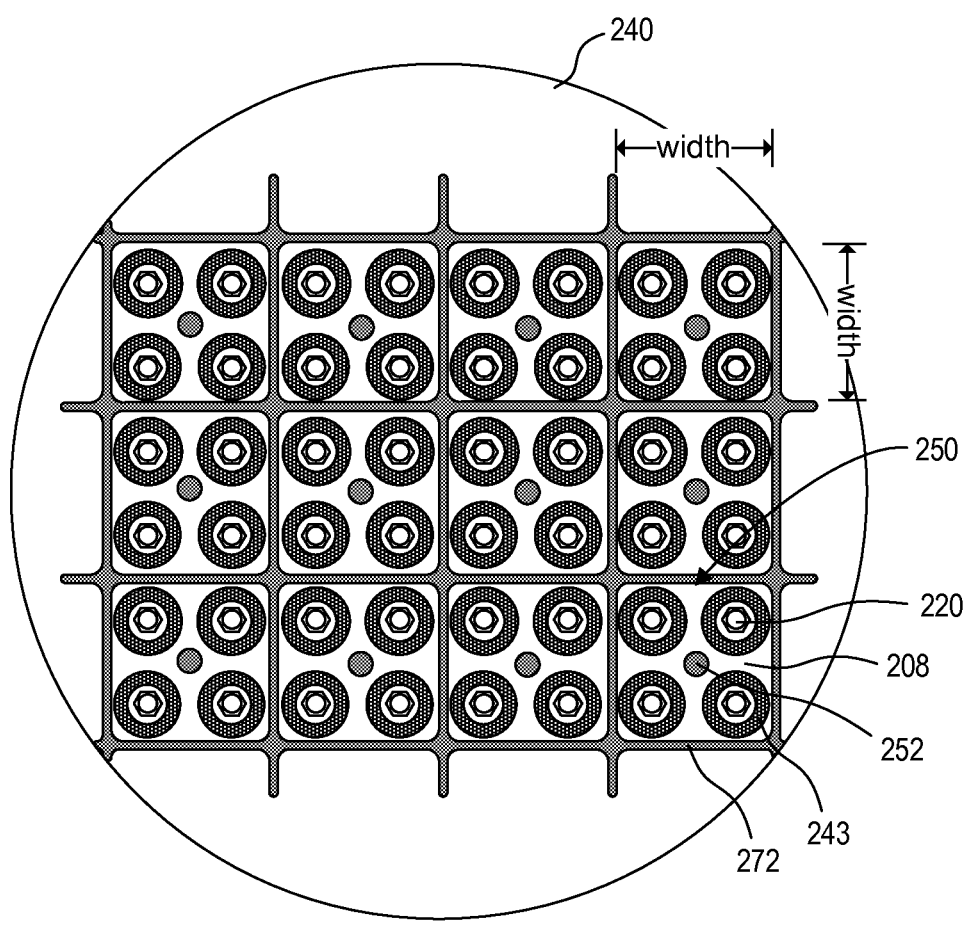
FIG. 15 is a schematic top-down view illustration of an array of nanowire devices on a carrier substrate in accordance with an embodiment of the invention.

FIG. 15 is a schematic top-bottom view illustration of an array of nanowire devices 250 carried on a carrier substrate 240 in accordance with an embodiment of the invention. In the exemplary embodiment illustrated, each nanowire device includes a plurality of nanowires 220 on the base layer 208. Staging cavity sidewalls 272 may laterally surround the base layer 208 and one or more nanowires 220 for each nanowire device 250. One or more stabilization posts 252 support each nanowire device 250. In an embodiment, each nanowire device includes a base layer 208 may having a top surface 207 characterized by a maximum length or width of 300 µm or less, or more particularly 100 µm or less. In an embodiment, each base layer 208 has a top surface 207 characterized by a maximum length or width of 1 to 20 µm. As illustrated, the top surface 207 of the base layer is approximately the maximum width of the nanowire device 250.

Figure 16A:
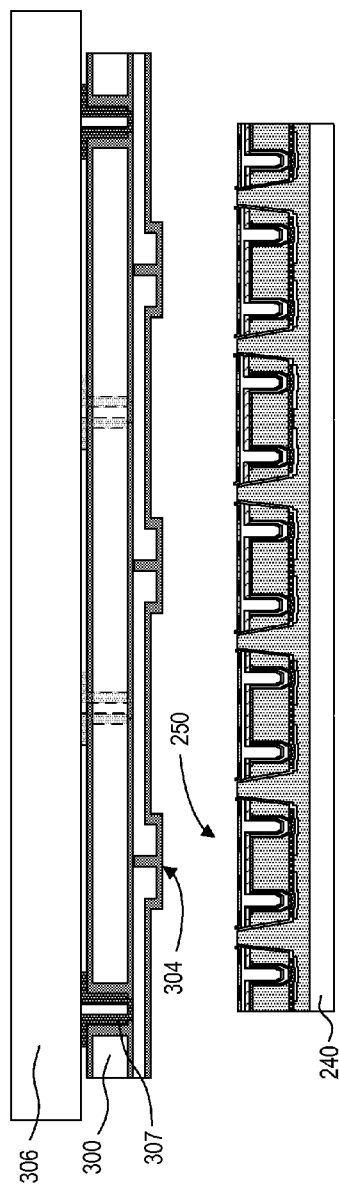
FIG. 16A-16E are cross-sectional side view illustrations of an array of electrostatic transfer heads transferring nanowire devices from a carrier substrate to a receiving substrate in accordance with an embodiment of the invention.
Figure 16B:
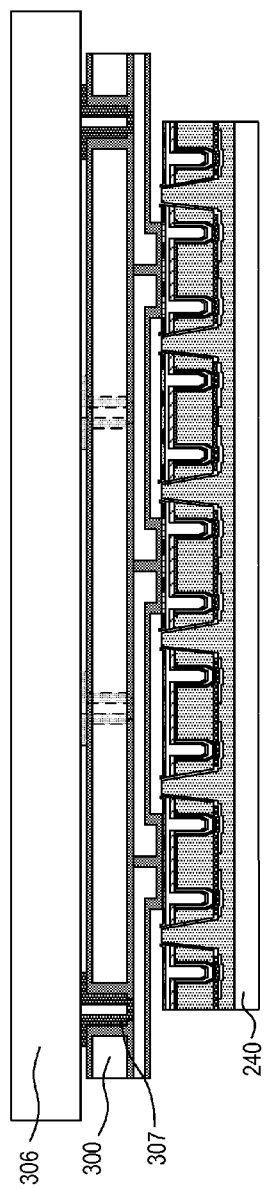
Figure 16C:
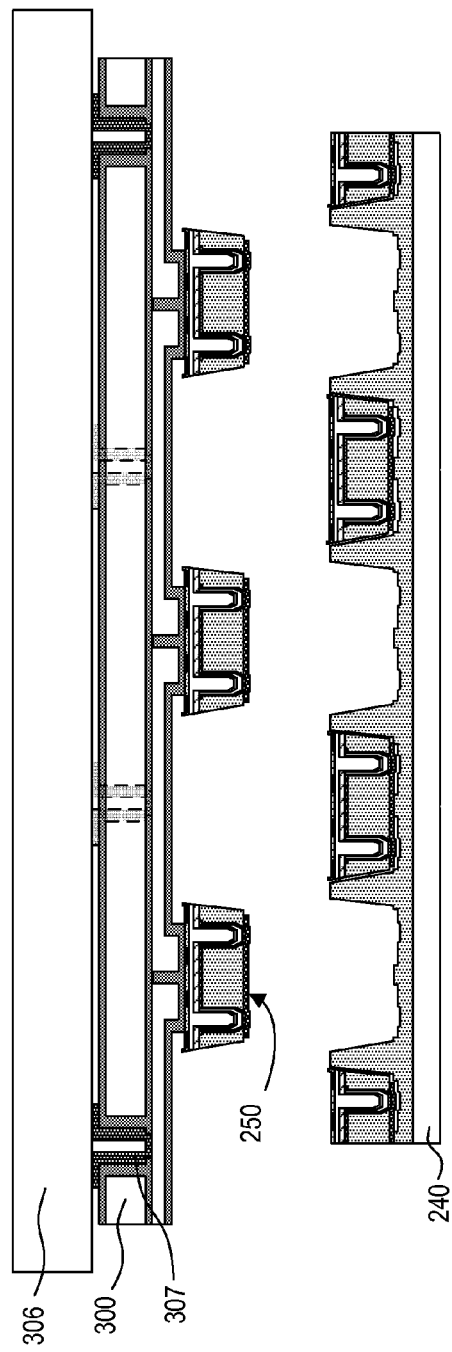
Figure 16D:
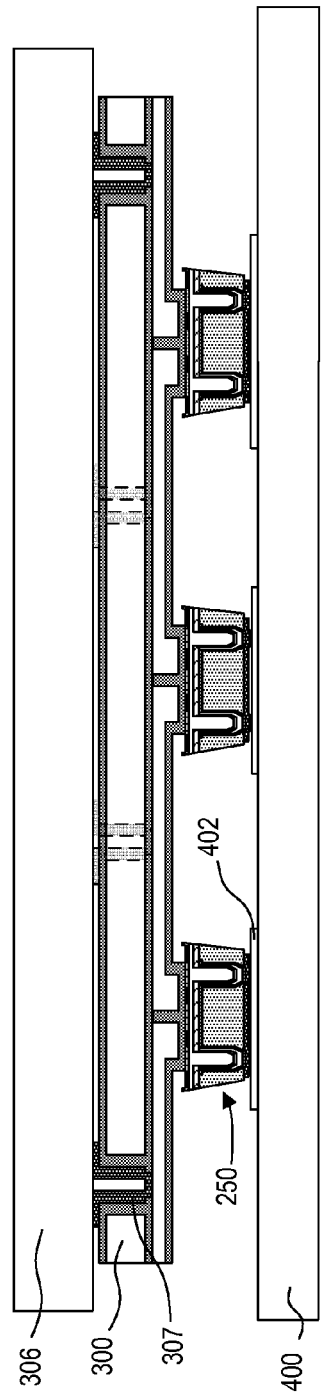
Figure 16E:
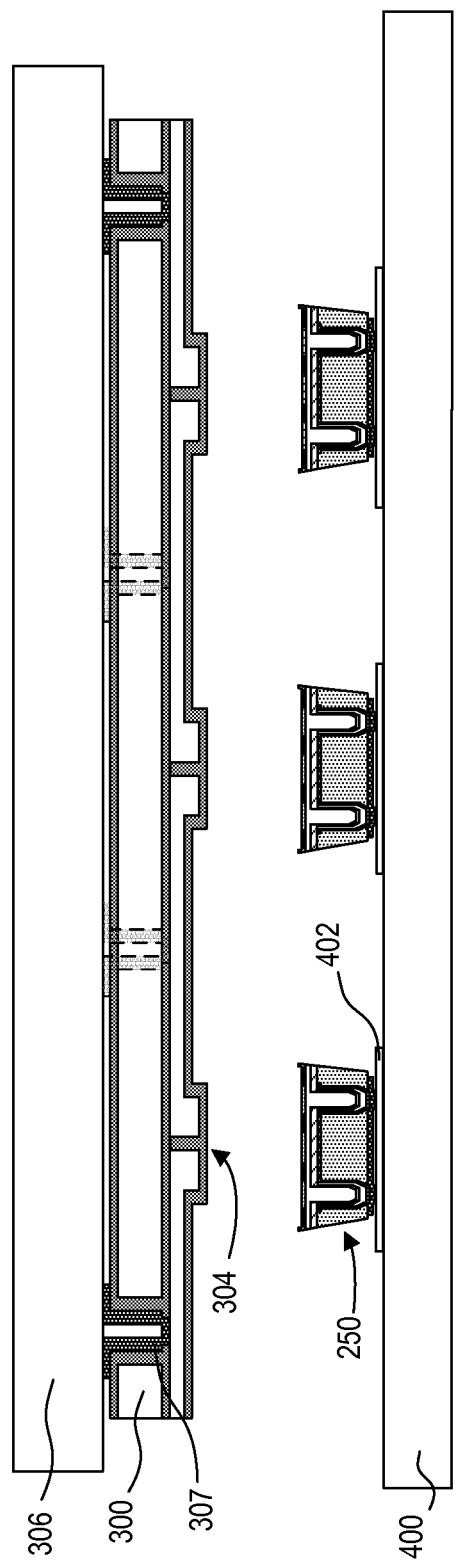

FIGS. 16A-16E are cross-sectional side view illustrations of an array of electrostatic transfer heads 304 transferring nanowire devices 250, which may be nanowire LED devices, from carrier substrate 240 to a receiving substrate 300 in accordance with an embodiment of the invention. FIG. 16A is a cross-sectional side view illustration of an array of micro device transfer heads 304 supported by substrate 300 and positioned over an array of nanowire devices 250 stabilized on carrier substrate 240. The array of nanowire devices 250 is then contacted with the array of transfer heads 304 as illustrated in FIG. 16B. As illustrated, the pitch of the array of transfer heads 304 is an integer multiple of the pitch of the array of nanowire devices 250. A voltage is applied to the array of transfer heads 304. The voltage may be applied from the working circuitry within a transfer head assembly 306 in electrical connection with the array of transfer heads through vias 307. The array of nanowire devices 250 is then picked up with the array of transfer heads 304 as illustrated in FIG. 16C. The array of nanowire devices 250 is then placed in contact with contact pads 402 (e.g. gold, indium, tin, etc.) on a receiving substrate 400, as illustrated in FIG. 16D. The array of nanowire devices 250 is then released onto contact pads 402 on receiving substrate 400 as illustrated in FIG. 16E. For example, the receiving substrate may be, but is not limited to, a display substrate, a lighting substrate, a substrate with functional devices such as transistors or ICs, or a substrate with metal redistribution lines.

In accordance with embodiments of the invention, heat may be applied to the carrier substrate, transfer head assembly, or receiving substrate during the pickup, transfer, and bonding operations. For example, heat can be applied through the transfer head assembly during the pick up and transfer operations, in which the heat may or may not liquefy nanowire device bonding layers. The transfer head assembly may additionally apply heat during the bonding operation on the receiving substrate that may or may not liquefy one of the bonding layers on the nanowire device or receiving substrate to cause diffusion between the bonding layers.

The operation of applying the voltage to create a grip pressure on the array of nanowire devices can be performed in various orders. For example, the voltage can be applied prior to contacting the array of nanowire devices with the array of transfer heads, while contacting the nanowire devices with the array of transfer heads, or after contacting the nanowire devices with the array of transfer heads. The voltage may also be applied prior to, while, or after applying heat to the bonding layers.

Where the transfer heads 304 include bipolar electrodes, an alternating voltage may be applied across a the pair of electrodes in each transfer head 304 so that at a particular point in time when a negative voltage is applied to one electrode, a positive voltage is applied to the other electrode in the pair, and vice versa to create the pickup pressure. Releasing the array of nanowire devices from the transfer heads 304 may be accomplished with a varied of methods including turning off the voltage sources, lower the voltage across the pair of electrodes, changing a waveform of the AC voltage, and grounding the voltage sources.

Figure 17:
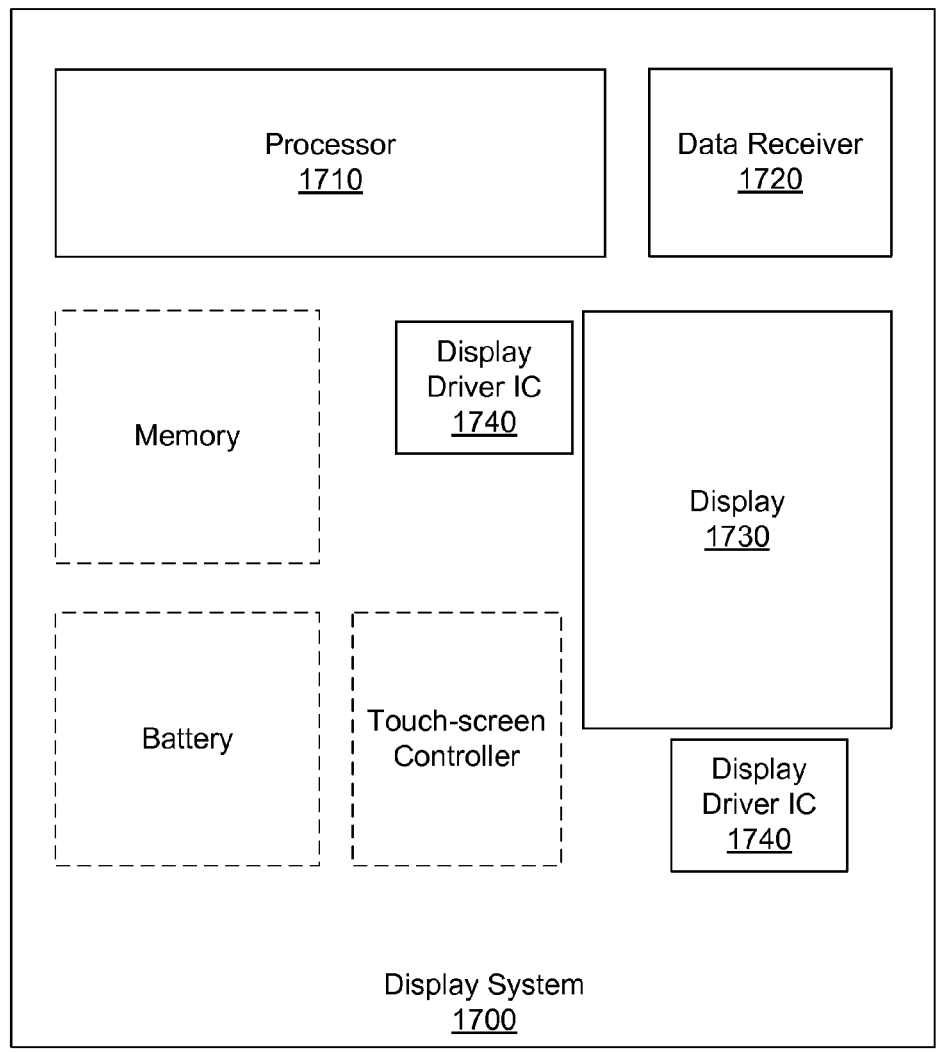
FIG. 17 is a schematic illustration of a display system in accordance with an embodiment of the invention.

FIG. 17 illustrates a display system 1700 in accordance with an embodiment. The display system houses a processor 1710, data receiver 1720, a display 1730, and one or more display driver ICs 1740, which may be scan driver ICs and data driver ICs. The data receiver 1720 may be configured to receive data wirelessly or wired. Wireless may be implemented in any of a number of wireless standards or protocols including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The one or more display driver ICs 1740 may be physically and electrically coupled to the display 1730.

In some embodiments, the display 1730 includes one or more nanowire devices 250 that are formed in accordance with embodiments of the invention described above. Depending on its applications, the display system 1700 may include other components. These other components include, but are not limited to, memory, a touch-screen controller, and a battery. In various implementations, the display system 1700 may be a television, tablet, phone, laptop, computer monitor, kiosk, digital camera, handheld game console, media display, ebook display, or large area signage display.

Figure 18:
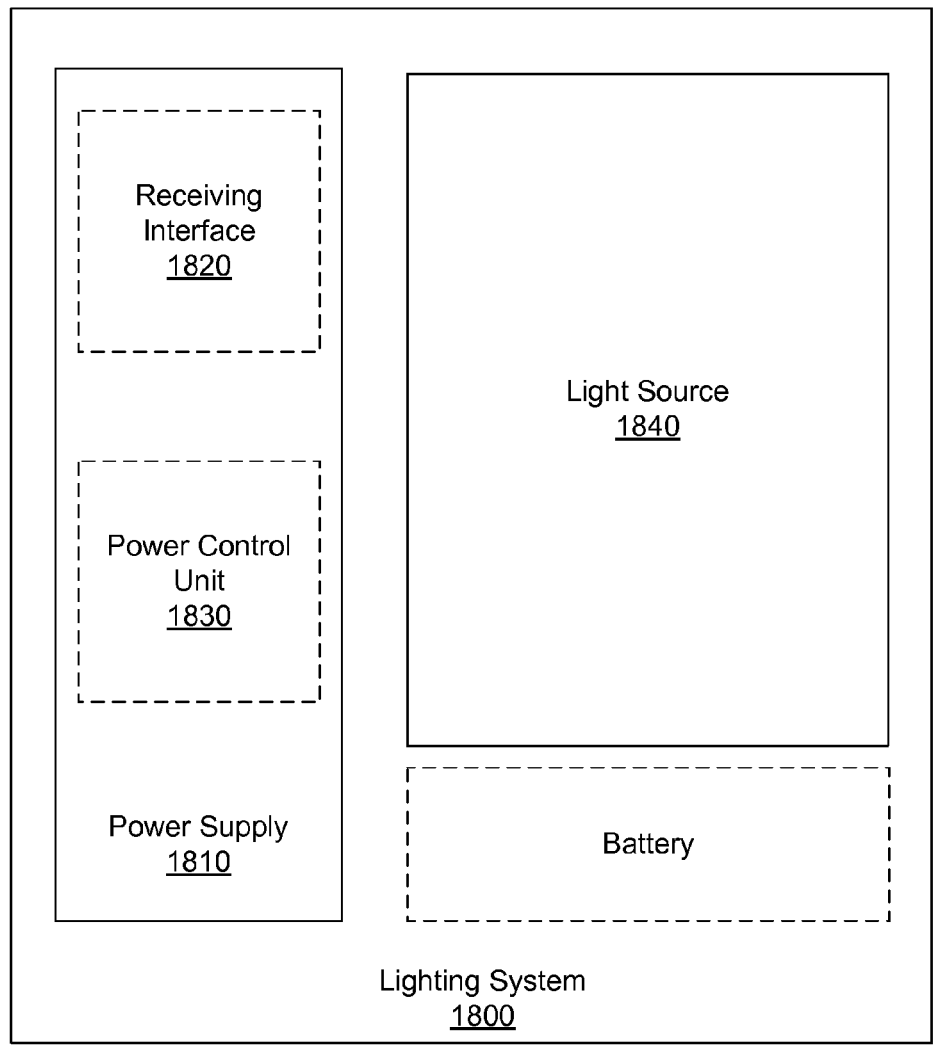
FIG. 18 is a schematic illustration of a lighting system in accordance with an embodiment of the invention.

FIG. 18 illustrates a lighting system 1800 in accordance with an embodiment. The lighting system houses a power supply 1810, which may include a receiving interface 1820 for receiving power, and a power control unit 1830 for controlling power to be supplied to the light source 1840. Power may be supplied from outside the lighting system 1800 or from a battery optionally included in the lighting system 1800. In some embodiments, the light source 1840 includes one or more nanowire devices 250 that are formed in accordance with embodiments of the invention described above. In various implementations, the lighting system 1800 may be interior or exterior lighting applications, such as billboard lighting, building lighting, street lighting, light bulbs, and lamps.

In utilizing the various aspects of this invention, it would become apparent to one skilled in the art that combinations or variations of the above embodiments are possible for fabricating and transferring nanowire devices. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A nanowire device comprising:
   a base layer including a first surface and a second surface opposite the first surface, wherein the second surface has a maximum lateral dimension of 1 to 100 µm;
   a plurality of nanowires on and protruding away from the first surface of the base layer; wherein each nanowire comprises a core, a shell, and an active layer between the core and the shell;
   an encapsulation material laterally surrounding the plurality of nanowires, such that the plurality of nanowires is embedded within the encapsulation material;
   a top electrode layer on the second surface of the base layer opposite the first surface and in electrical contact with the core of each nanowire; and
   a bottom electrode layer in electrical contact with the shell of each nanowire.

2. The nanowire device of claim 1, wherein the top electrode layer is transparent or semi-transparent to the visible wavelength spectrum.

3. The nanowire device of claim 1, wherein the bottom electrode includes a mirror layer.

4. The nanowire device of claim 1, wherein the bottom electrode includes a bonding layer formed of a noble metal.

5. The nanowire device of claim 1, further comprising one or more bottom conductive contacts on and surrounding the shells of the plurality of nanowires, wherein the bottom electrode layer is in electrical contact with the one or more bottom conductive contacts.

6. The nanowire device of claim 5, wherein the bottom electrode layer spans along a bottom surface of the encapsulation material.

7. The nanowire device of claim 1, further comprising a patterned mask layer on the base layer, wherein the cores of the plurality of nanowires extend through corresponding openings in the patterned mask layer.

8. The nanowire device of claim 1, wherein the encapsulation material comprises a thermoset material.

9. The nanowire device of claim 7, wherein the encapsulation material is transparent to the visible wavelength spectrum.

10. The nanowire device of claim 1, wherein the second surface has a maximum lateral dimension of 1 to 20 µm.

11. The nanowire device of claim 1, further comprising a through-hole through an entire thickness of the base layer located laterally between two nanowires.

12. The nanowire device of claim 1, wherein the bottom electrode layer is bonded to and in electrical contact with a contact pad of a display substrate.

13. The nanowire device of claim 1, wherein the bottom electrode layer is bonded to a display substrate with a material comprising indium or tin.

14. The nanowire device of claim 1, wherein the top electrode layer has a planar top surface.

15. A structure comprising:
   a carrier substrate;
   a stabilization layer on the carrier substrate;
   an array of nanowire devices on the stabilization layer:
   wherein each nanowire device comprises:
      a base layer including a first surface and a second surface opposite the first surface, wherein the second surface has a maximum lateral dimension of 1 to 100 µm;
      a plurality of nanowires on and protruding away from the first surface of the base layer; wherein each nanowire comprises a core, a shell, and an active layer between the core and the shell;
      an encapsulation material laterally surrounding the plurality of nanowires, such that the plurality of nanowires is embedded within the encapsulation material;
      a top electrode layer on the second surface of the base layer opposite the first surface and in electrical contact with the core of each nanowire; and
      a bottom electrode layer in electrical contact with the shell of each nanowire.

16. The structure of claim 15, further comprising a sacrificial release layer spanning between the stabilization layer and the array of nanowire devices.

17. The nanowire device of claim 16, wherein the stabilization layer comprises a thermoset material.

18. The nanowire device of claim 16, wherein the stabilization layer comprises an array of staging cavities, and the array of nanowire devices is within the array of staging cavities.

19. The nanowire device of claim 16, wherein the stabilization layer comprises an array of stabilization posts, and the array of nanowire devices is supported by the array of stabilization posts.

20. The nanowire device of claim 19, wherein the bottom electrode layer for each nanowire device is bonded to a corresponding stabilization post.

* * * * *